United States Patent
Cheung et al.

(10) Patent No.: US 6,538,508 B2
(45) Date of Patent: Mar. 25, 2003

(54) PROGRAMMABLE GAIN AMPLIFIER WITH GLITCH MINIMIZATION

(75) Inventors: Yee Ling Cheung, Irvine, CA (US); Kevin T. Chan, Pasadena, CA (US); Siavash Fallahi, Newport Coast, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 09/969,793

(22) Filed: Oct. 4, 2001

(65) Prior Publication Data

US 2002/0158690 A1 Oct. 31, 2002

Related U.S. Application Data

(60) Provisional application No. 60/286,534, filed on Apr. 27, 2001.

(51) Int. Cl.[7] .................................................. H03F 1/36
(52) U.S. Cl. ........................ 330/86; 330/144; 330/282; 330/284
(58) Field of Search ........................ 330/86, 144, 282, 330/284

(56) References Cited

U.S. PATENT DOCUMENTS 6,198,349 B1 * 3/2001 Kanno et al. ............... 330/282

FOREIGN PATENT DOCUMENTS

JP            11261764        * 9/1999

OTHER PUBLICATIONS

Gano et al. "New multiple input fully differential variable gain CMOS instrumentation amplifier" Circuits and Systems vol. 4, 2000 pp. 449–452.*

* cited by examiner

Primary Examiner—Michael B Shingleton
(74) Attorney, Agent, or Firm—Sterne, Kessler, Goldstein & Fox P.L.L.C.

(57) ABSTRACT

A programmable gain amplifier (PGA) has an amplifier and a variable resistor that is connected to the output of the amplifier. The variable resistor includes a resistor that is connected to a reference voltage and multiple parallel taps that tap off the resistor. A two-stage switch network having fine stage switches and coarse stage switches connects the resistor taps to an output node of the PGA. The taps and corresponding fine stage switches are arranged into two or more groups, where each group has n-number of fine stage switches and corresponding taps. One terminal of each fine stage switch is connected to the corresponding resistor tap, and the other terminal is connected to an output terminal for the corresponding group. The coarse stage switches select from among the groups of fine stage switches, and connect to the output of the PGA. During operation, one selected tap is connected to the output of the PGA by closing the appropriate fine stage switch and coarse stage switch, where the selected tap defines a selected group of the fine stage switches. Additionally, one fine stage switch is closed in each of the non-selected groups of fine stage switches. In one embodiment, the location of the closed switches in the non-selected groups is the mirror image of the location in an adjacent group. This reduces the transient voltages that occur when tap selection changes from one group to another.

20 Claims, 13 Drawing Sheets

PROGRAMMABLE GAIN AMPLIFIER WITH GLITCH MINIMIZATION

This application claims the benefit of U.S. Provisional Application No. 60/286,534, filed on Apr. 27, 2001, which is incorporated herein by reference in its entirety.

BACKGROUND OF THE INVENTION

1. Field of the Invention

The present invention generally relates to automatic gain control in a receiver, and more specifically to a programmable gain amplifier (PGA) that performs automatic gain control while minimizing transient voltages during tap changes.

2. Background Art

In electronic communications, electromagnetic signals carry information between two nodes over a connecting medium. Exemplary media include cable, optical fiber, public airways, etc. The signal strength at the receiving node varies depending on the distance between the nodes and changes in the condition of the medium. For example, the signal strength typically decreases with increasing distance between the two nodes. Furthermore, even if the distance is fixed, physical variations in the medium over time can affect signal strength. For example, in a cable system, different cables can have different attenuation constants. Also, increased moisture content in a cable line, or in the public airways can reduce signal strength at the receiver. Finally, variations in transmitter output power will also affect signal strength at the receiver.

An automatic gain control (AGC) circuit and a programmable gain amplifier (PGA) are often used at the receiver input to compensate for variations of received signal strength. More specifically, the AGC circuit adjusts the gain setting of the PGA to maintain the signal strength within a desired operating range. If the received signal strength is too high, then the AGC lowers the gain setting of the PGA. If the received signal strength is too low, then the AGC raises the gain setting of the PGA. When the AGC is changing the gain of the PGA, there is a possibility of introducing a glitch in the system. The glitch manifests itself as an unwanted transient voltage that can cause a voltage detection error if the transient voltage does not settle within specified time period, for example one clock cycle.

What is needed is PGA configuration that quickly settles any transient voltage caused by changing gain settings. Furthermore, the PGA configuration should have sufficient operating bandwidth.

BRIEF SUMMARY OF THE INVENTION

The present invention is a programable gain amplifier (PGA) having an amplifier and a variable resistor that is connected to the output of the amplifier. The variable resistor includes a resistor that is connected to a ground or reference voltage, and multiple parallel taps that tap off the resistor. Additionally, the PGA includes a two-stage switch network having fine stage switches and coarse stage switches that connect the resistor taps to an output node of the PGA. The taps and corresponding fine stage switches are arranged into two or more groups, where each group has n-fine stage switches and corresponding taps. One terminal of each fine stage switch is connected to the corresponding resistor tap, and the other terminal is connected to an output terminal for the corresponding group. The coarse stage switches are connected to corresponding group output terminals and select a group of fine stage switches to connect to the output of the PGA.

During operation, one tap is selected to be connected to the output of the PGA by closing the appropriate fine stage switch and coarse stage switch, where the selected tap defines a selected group of the fine stage switches. Additionally, one fine stage switch is closed in each of the non-selected groups of fine stage switches. In one embodiment, the location of the closed switches in the non-selected groups is the mirror image of the location in an adjacent group. In other words, if the $m^{th}$ fine stage switch is closed in a first group of fine stage switches, then the $[(n+1)-m]^{th}$ fine stage switch is closed a second group of fine stage switches that is adjacent to the first group of fine stage switches, assuming the fine stage switches are indexed from 1-to-n in each group. This reduces the transient voltages that occur when tap selection changes from one group to another.

Further features and advantages of the present invention, as well as the structure and operation of various embodiments of the present invention, are described in detail below with reference to the accompanying drawings.

BRIEF DESCRIPTION OF THE DRAWINGS/ FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

1. Example Receiver Application

Before describing the invention in detail, it is useful to describe an example receiver environment for the invention. The programable gain amplifier (PGA) invention is not limited to the receiver environment that is described herein, as the PGA invention is applicable to other receiver and non-receiver applications as will be understood to those skilled in the relevant arts based on the discussions given herein.

Figure 1:
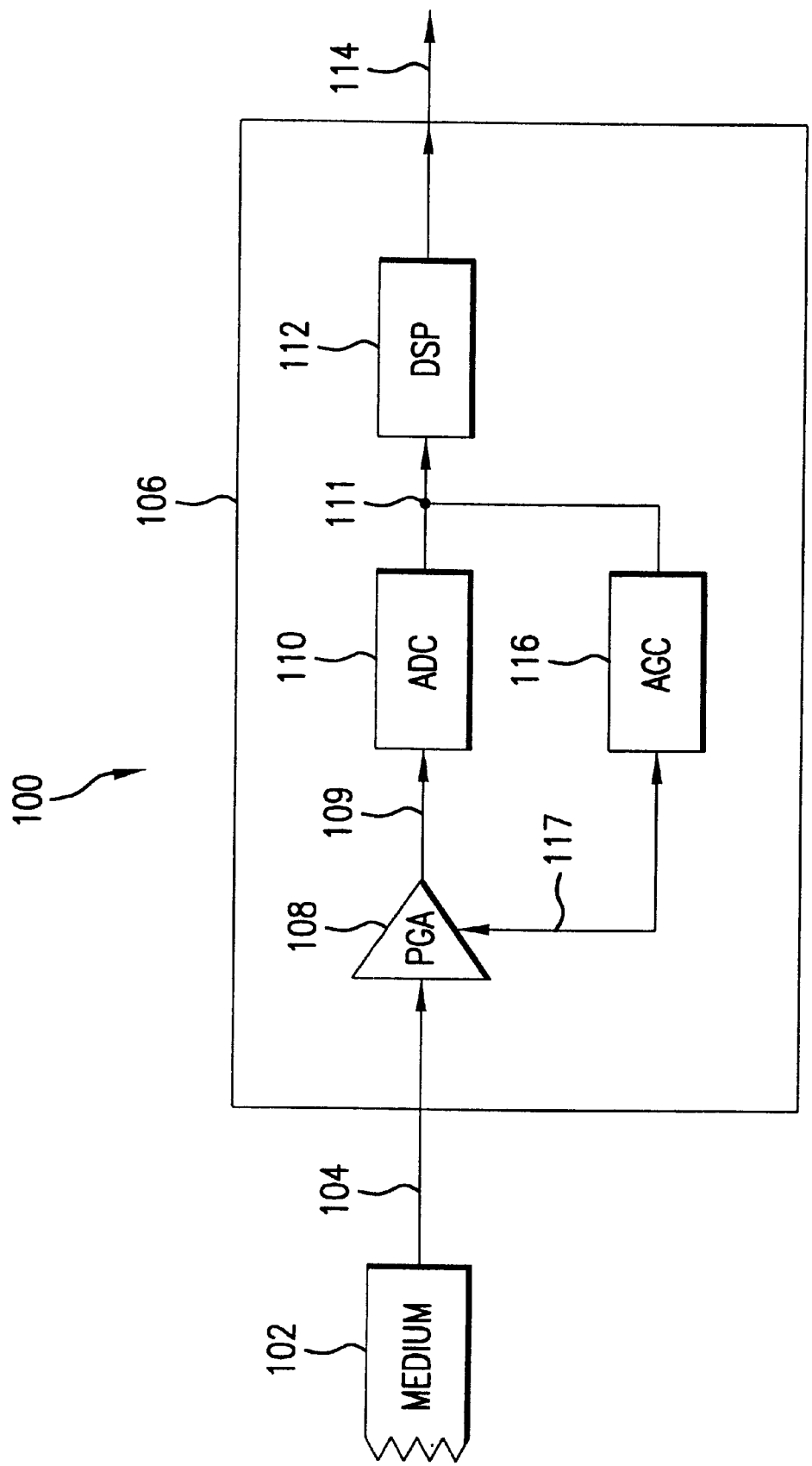
FIG. 1 illustrates an exemplary receiver environment having a programable gain amplifier (PGA)

FIG. 1 illustrates an environment 100 having a medium 102, and a receiver 106 that receives a communications signal 104 carried by the medium 102. The receiver 106 includes a programable gain amplifier (PGA) 108, an analog-to-digital converter (ADC) 110, a digital signal processor (DSP) 112, and an automatic gain control (AGC) 116. The receiver 106 receives the communications signal 104 from the medium 102, and extracts an information signal 114. More specifically, the PGA 108 receives the communications signal 104 and variable amplifies the signal 104 as determined by the AGC 116 to generate a PGA output signal 109. The ADC 110 converts the PGA output 109 to a digital signal 111. The DSP 112 processes the digital signal 111 to generate the information signal 114. For example, the DSP 112 examines the voltage of the digital signal 111 to determine if the voltage represents a "0" or a "1" in order to retrieve the information signal 114. The DSP 112 may also perform a cyclic redundancy check (CRC) on the bit stream of the digital signal 111 to determine if there have been any errors that were introduced during transmission.

The signal strength of the input signal 104 can vary based on the physical characteristics of the medium 102. In cable systems for example, a longer cable will typically have more attenuation than a shorter cable, thereby affecting the signal strength of the signal 104. In order to compensate, the AGC 116 detects the signal strength of the digital signal 111 and adjusts the gain settings of the PGA 108 using AGC control signal 117 to maintain a relatively constant signal strength. For example, if the signal strength of the digital signal 111 is too weak, then the AGC 116 increases the gain setting of the PGA 108 to increase the signal strength. Alternatively, if the signal strength of the digital signal 111 is too strong, then the AGC 116 decreases the gain setting of the PGA 108 to decrease the signal strength.

Without AGC compensation, these signal strength variations would adversely affect the accuracy of the information signal 114. For example, if the received signal 104 is too strong, then the ADC 110 can be saturated. Conversely, if the digital signal 111 is too weak, false positives can be generated during the CRC error check that is performed by the DSP 112.

2. Conventional PGA

Figure 2:
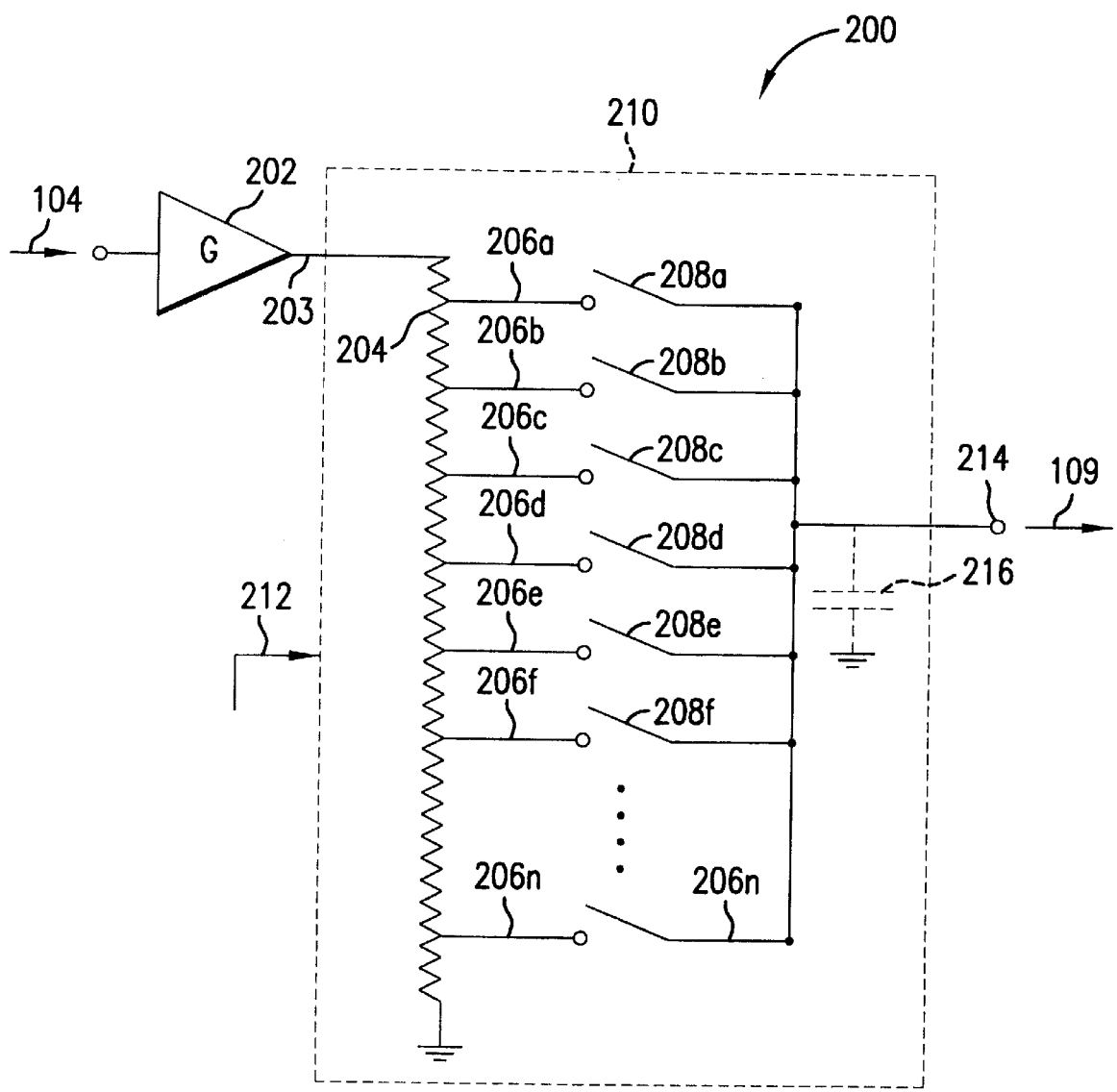
FIG. 2 illustrates a conventional PGA 200.

FIG. 2 illustrates a conventional PGA 200 that includes an amplifier 202 and a variable resistor 210 that is connected to the output of the amplifier 202. The amplifier 202 can be any type amplifier including a buffer amplifier. The variable resistor 210 includes a resistor 204 that connects the output of the amplifier 202 to ground or a reference voltage. The resistor 204 has multiple parallel taps 206a–n that tap off the resistor 204 (e.g. resistor ladder) to a common node 214, which is the output of the PGA 200. Switches 208a–n connect the corresponding taps 206a–n to the common node 214. The switches 208 are controlled by a control signal 212, such as the AGC 117.

During operation, the amplifier 202 amplifies the received communications signal 104 to generate an amplified signal 203. The amplified signal 203 travels through the resistor 204, and is tapped off the resistor 204 to the output 214 by a corresponding switch 208. Typically, only one switch 208 is closed at a time, so that only one tap 206 is connected the common node 214. The tap 206 that is connected to the common node 214 is referred to herein as the "selected tap".

As such, the variable amplifier 210 provides a variable series resistance that attenuates the amplified signal 203, where the attenuation increases with increasing resistance. The resistance, and therefore the attenuation, varies depending on which tap 206 is connected the common node 214. The lowest resistance and attenuation occur when the tap 206a is the selected tap. The highest resistance and the highest attenuation occur when the tap 206n is the selected tap. The attenuation is increased by incrementally selecting taps in the direction from 206a to 206n. Likewise, the attenuation is decreased by selecting taps in the direction of 206n to 206a.

For example, assume that switch 208b is closed to select the tap 206b as an initial condition. The attenuation can be increased relative to the initial condition by opening switch 208b and closing switch 208c so as to select tap 206c. The attenuation can be decreased relative to the initial condition by opening the switch 208b and closing the switch 208a to select the tap 204a.

Typically, the PGA 200 is implemented on a integrated circuit (IC) where the circuit elements are deposited on the IC using known layout and processing techniques. Each switch 208 has a parasitic capacitance to the IC ground, which causes an effective parasitic capacitance 216 to ground at the common node 214, as shown in FIG. 2. The effective capacitance 216 limits the frequency bandwidth as will be understood by those skilled in the arts. Further, the effective capacitance 216 increases with the number of switches 208 (and therefore the number of taps 206) because the switches 208 are in parallel, and parallel capacitance is cumulative. Therefore, the frequency bandwidth of the PGA 200 decreases as the number of taps 206 (and switches 208) increases. As a result, there is trade-off between the granularity of the attenuation (i.e. number of taps) in the PGA 200, and the frequency bandwidth of the PGA 200.

3. PGA Description

Figure 3A:
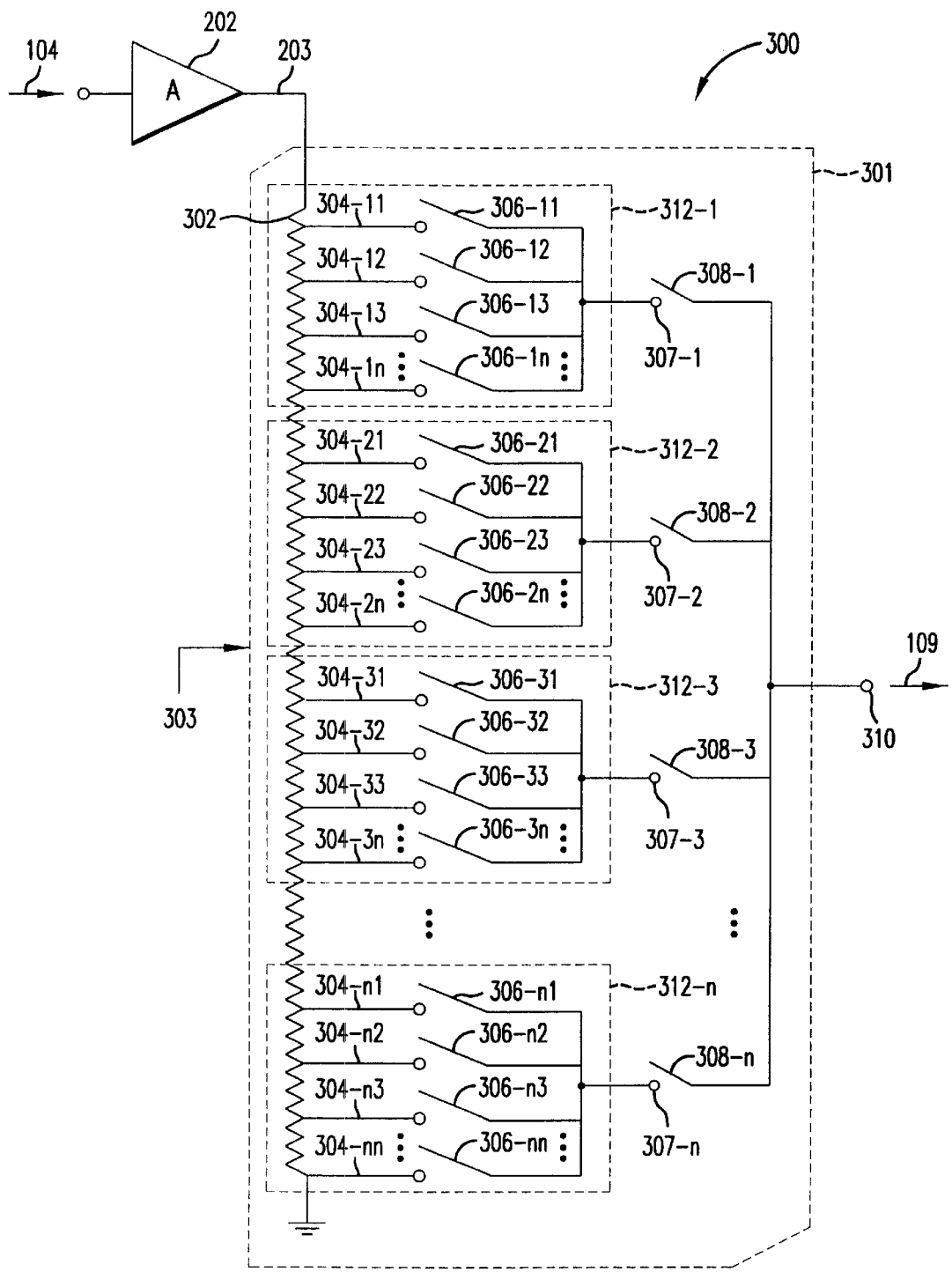
FIG. 3A illustrates a PGA 300 with a two stage switch configuration according to embodiments of the invention.

FIG. 3A illustrates a PGA 300 according to one embodiment of the present invention. The PGA 300 includes the amplifier 202 and a variable resistor 301. Similar to the PGA 200, the variable resistor 301 includes a resistor 302 that connects the output of the amplifier 202 to ground or a reference voltage, and has multiple taps 304 that tap off the resistor 302 (e.g. resistor ladder). Additionally, the PGA 300 includes a two stage switch configuration that connects the taps 304 to an output node 310 of the PGA 300, instead of the single stage switch configuration in the PGA 200. More specifically, the taps 304 are connected to the output node 310 by fine stage switches 306 and coarse stage switches 308. The taps 304 and corresponding fine stage switches 306 are arranged in two or more groups 312, where each group 312 has a group output terminal 307. One terminal of each fine stage switch 306 is connected to the corresponding tap 304, and the other terminal is connected to the group output terminal 307 for the corresponding group 312. The output terminal 307 for each group 312 is connected to the PGA output node 310 by the corresponding coarse stage switch 308.

The nomenclature for the reference numbers in FIG. 3A is as follows. The groups 312 of switches 306 have been indexed from 1-to-n moving down the page. For example, the first group is 312-1, the second group is 312-2, etc. The elements inside the groups 312 are given two index numbers after the "–" represented here as "–ab". The "a" represents the specific group 312 number in which the elements are located, and the "b" represents the element index within the group 312. For example, all the switches 306 in group 312-1 are given a corresponding "–1" for the "a" index, and then numbered from 1-to-n for the "b" index. As a result, the switches 306 in group 312-1 are referenced as 306-11, 306-12, 306-13, . . . to 306-1n. The switches 306 in group 312-2 are references as 306-21, 306-22, 306-23 . . . 306-2n. As will be apparent, there can be any number of switches 306 in a particular group 312, and any number of groups 312. A greater number of taps 304 permits smaller changes in incremental attenuation, as will be apparent to those skilled in the arts.

During operation, the amplifier 202 amplifies the received communications signal 104 to generate an amplified signal 203. The amplified signal 203 travels through the resistor 302, and is tapped off the resistor 302 at a selected tap 304 to the output node 310. The amplified signal 203 is tapped off the resistor 302 by closing the appropriate switches 306 and 308. Therefore, the resistor 302 provides a variable series resistance that attenuates the amplified signal 203. The amount of attenuation depends on which tap 304 is selected to be connected to the output node 310 by the switches 306 and 308. A gain control signal 303 determines the selected tap 304 by closing the appropriate fine stage switch 306 and coarse stage switch 308. For example, the gain control signal 303 can be an AGC signal, such as AGC 117 in FIG. 1A.

Herein, the term "selected tap" will be used to refer to the tap 304 that is connected to the output 310 by the switches 306 and 308. Similarly, the fine stage switch 306 that corresponds to the selected tap 304 may be referred to as the "selected switch" 306. Similarly, the group 312 that contains the selected tap 304 and corresponding selected switch 306 may be referred to as the "selected group" 312.

One fine stage switch 306 and one coarse stage switch 308 are closed in order to connect the selected tap 304 to the output node 310. For example, in order to select tap 304-11, then the fine stage switch 306-11 and the coarse stage switch 308-1 are closed. In order to select tap 304-23, the fine stage switch 306-23 and the coarse stage switch 308-2 are closed. The lowest resistance, and therefore the lowest attenuation occurs when the tap 304-11 is the selected tap. The highest resistance, and therefore the highest attenuation, occurs when the tap 304-nn is the selected tap. The attenuation is increased by incrementally selecting taps in the direction from 304-11 to 304-nn. Likewise, the attenuation is decreased by incrementally selecting taps in the direction from 304-nn to 304-11. For example, if tap 304-12 is the selected tap as an initial condition, then the attenuation can be increased by changing the selected tap to tap 304-13. Likewise, the attenuation can be decreased by changing the selected tap to tap 304-11.

As in the conventional PGA 200, the switches 306 and 308 have a parasitic capacitance to ground that effects the frequency bandwidth of the PGA 300. The effective capacitance for each group 312 of switches 306 is represented by capacitor 314 in FIG. 3B. The two stage switch configuration of the PGA 300 mitigates the effect of the group capacitances 314. This occurs because only the selected group 312 is connected to the output node 310 by the corresponding (closed) switch 308, and therefore only the parasitic capacitance 314 of the selected group 312 is in the signal transmission path. The remaining non-selected groups 312 are isolated by the corresponding (open) switches 308. For example, if the tap 304a is selected, then the switches 306a and 308a are closed. The remaining switches 308 are left open, and therefore only the effective parasitic capacitor 314a of the group 312a is connected to the output 310. The remaining effective parasitic capacitors 314 are isolated from the output node 310 by their respective open switches 308.

The PGA 300 is illustrated as a singled-ended configuration. However, the PGA 300 can be configured as differential PGA, as will be understood by those skilled in the arts.

4. Transient Voltage Considerations

Transient voltages can be created when the tap selection is changed to vary the attenuation of the PGA 300. The transient voltage occurs because the parasitic capacitances associated with switches 306 and 308 store and release energy when the switches are closed and opened. For example, if the tap selection is changed from 304-1n (in group 312-1) to tap 304-21 (in group 312-2), then the switches 306-1n and 308-1 are opened, and the switches 306-21 and 308-2 are closed. When the switch 306-1n is opened, charge that was stored on the parasitic capacitance of the switch 306-1n is discharged. Likewise, when the switch 308-2 is closed, charge is transferred and stored on the parasitic capacitance of the switches 306-21 until the parasitic capacitance is fully charged. The capacitor charging and discharging operations produce a transient voltage that appears at the output node 310 of the PGA 300. If the transient voltage does not settle quickly enough then it can cause false errors during the CRC calculations that are performed by the DSP 112 during demodulation. Therefore, it is preferable to minimize the effects of the transient voltages by settling the transient voltages as quickly as possible.

The settling time of the transient voltage can be reduced by closing additional fine stage switches 306, beyond the particular fine stage switch 306 that corresponds to the selected tap 304. By judicially closing switches 306 in non-selected groups 312, the parasitic capacitance for the fine stage switches 306 is pre-charged, thereby reducing the settling time of the transient voltage that accompanies a change in gain settings. The following sections describe two such configurations that reduce the transient voltage settling time by closing the additional fine stage switches 306 in non-selected groups 312.

5. Turn-on at Least One Switch in Each Group

Figure 4A:
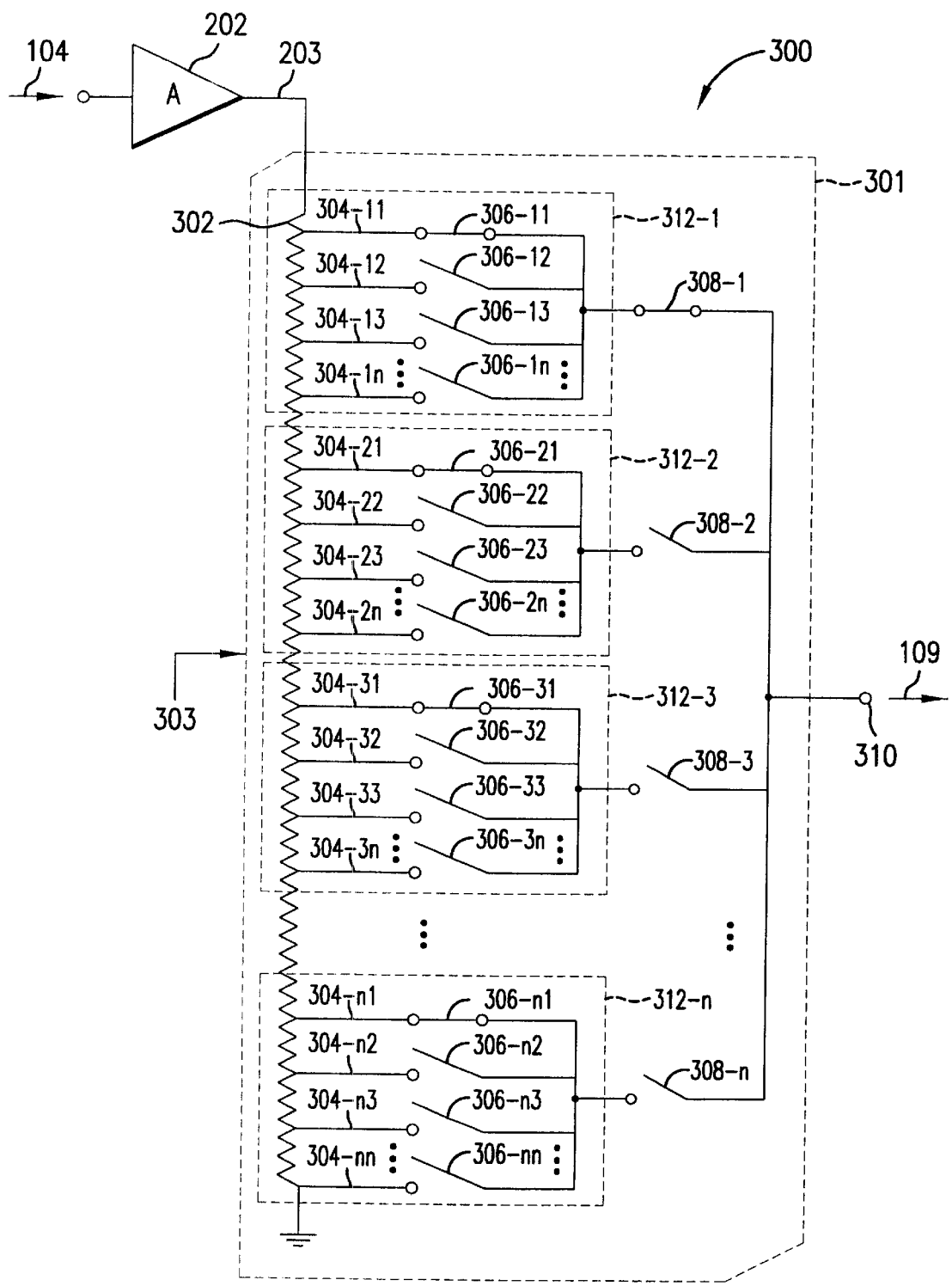
FIGS. 4A–4B illustrate example two stage switch PGA configurations with at least one switch turned on in each group of fine stage switches.
Figure 4B:
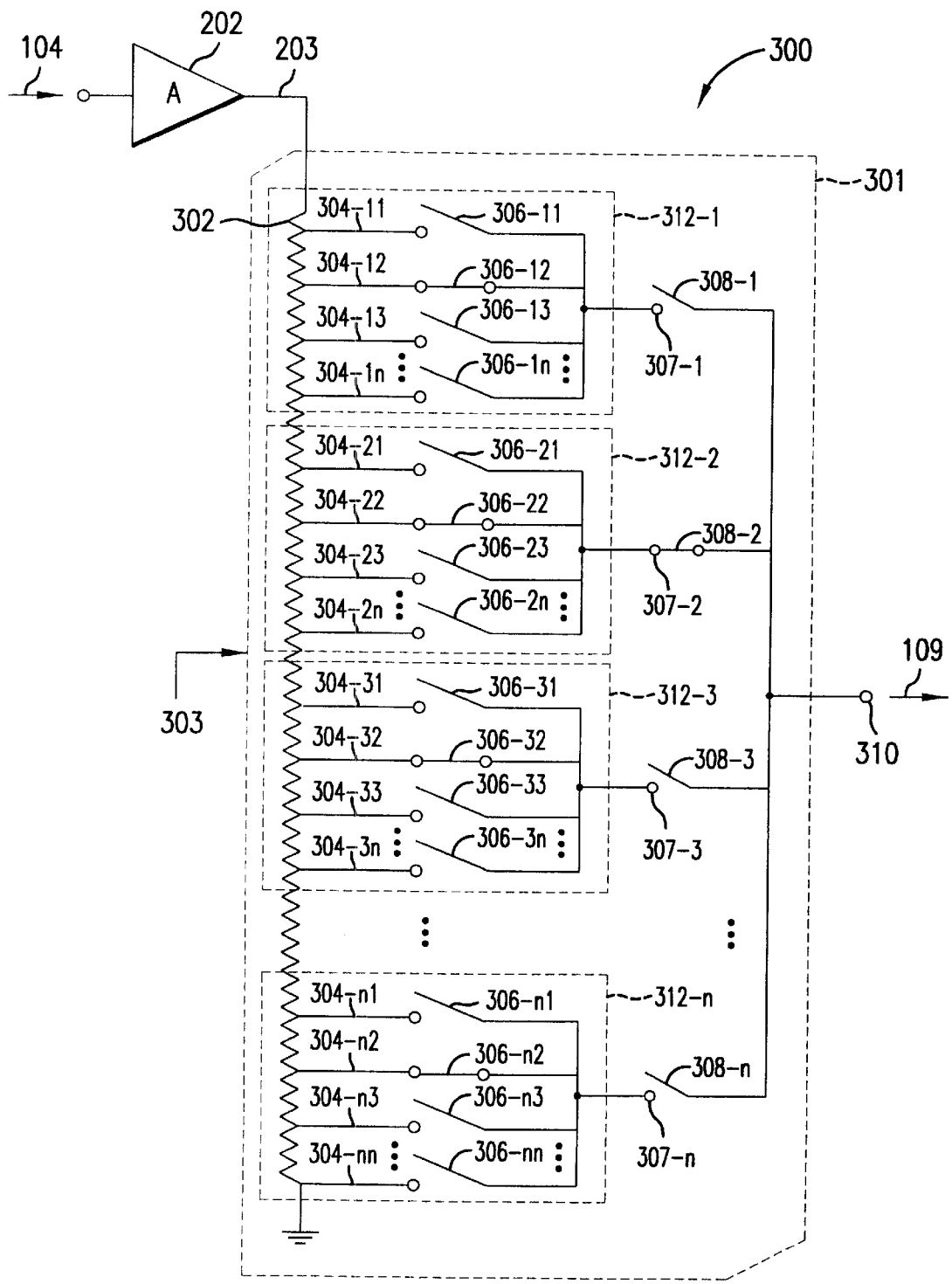

FIGS. 4A–4B illustrate one embodiment for reducing transient voltage settling time by closing additional switches 306 in non-selected groups 312. In this embodiment, at least one switch 306 is closed in each group 312, even in those groups 312 that do not have the selected tap 304. The switches 306 that are closed in the non-selected groups 312 have the same corresponding location (or index) as for the selected tap 304. The following examples further illustrate the switches 306 that are closed in the non-selected groups 312.

For example, in FIG. 4A, the tap 304-11 is the selected tap in the selected group 312-1, and therefore switches 306-11 and 308-1 are closed. Additionally, the following fine stages switches 304 in the non-selected groups 312 are also closed: switch 306-21 (in group 312-2), switch 306-31 (in group 312-3), and switch 306-n1 (in group 312n ), etc. Therefore, at least one switch 306 in each group 312 is closed at all times, which pre-charges the parasitic capacitance of the switches 306 in each group 312 by some amount. By pre-charging the parasitic capacitances, the transient voltage is reduced when the tap selection is changed to a new group 312. The coarse stage switches 308-2, 308-3, and 308-n for the corresponding non-selected groups 312-2,312-3 and 312-n are left open, thereby isolating the corresponding fine stage switches 306 in these groups from the output 310.

The closed switches 306 in the non-selected groups 308 have the same location (or "index") within the group 312 as for the selected switch 306-11 in the selected group 312-1. In other words, the selected tap 304-11 is the first tap in the group 312, and the corresponding switch 306 is the first switch in the group 312. Likewise, the closed switches 306-21, 306-31, and 306-n1 are also the first switches in their respective groups 312.

FIG. 4B illustrates a second example for this embodiment, where the tap 304-22 is the selected tap in the selected group 312-2. The switches 306-22 and 308-2 are closed to connect the selected tap 304-22 to the output 310. Additionally, the following fine stage switches in the non-selected groups 312 are also closed: switch 306-12 (in group 312-1), switch 306-32 (in group 312-3), and switch 306-n2 (in group 312-n), etc. The corresponding coarse stage switches 308-1, 308-3, and 308-n are left open.

6. Turn-on Switches in Each Group in a Mirror Image Order

Figure 5A:
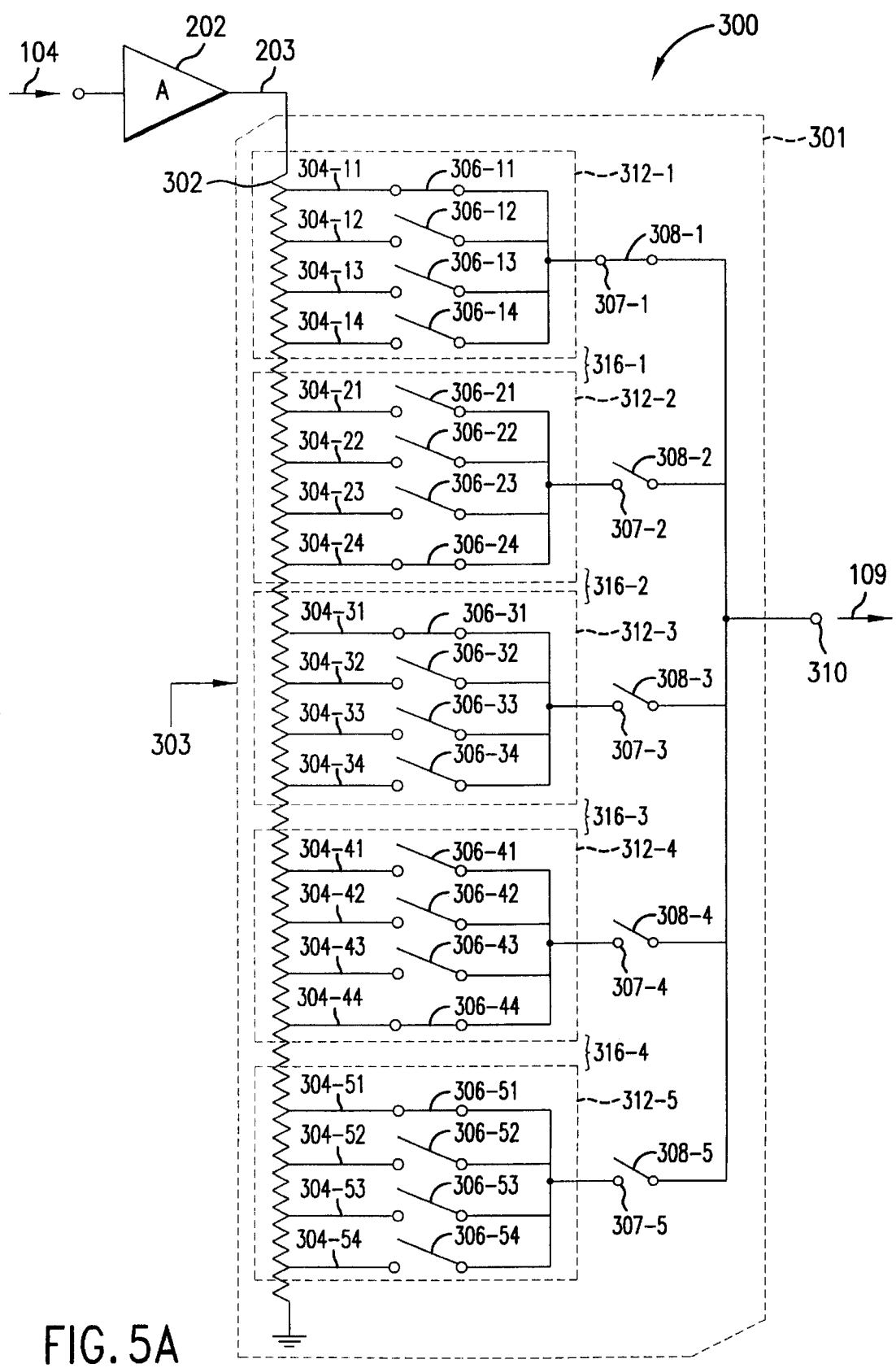
FIGS. 5A–5E illustrate example two stage switch PGA configurations with one or more switches turned on in each group of fine stage switches, according to embodiments of the present invention.

In a second embodiment, some of the closed switches 306 in non-selected groups 312 have a different relative location when compared to the location of the selected tap 304. More specifically, the location of the closed switches 306 in the non-selected groups is the mirror image of the location in an adjacent group 312. FIGS. 5A–5E further illustrate the location of the closed switches 306 in the non-selected groups 312 according to this mirror image embodiment. FIG. 5A illustrates an initial switch configuration for an initial attenuation setting. FIGS. 5B–5E illustrate the progression of switch configurations for increased attenuation and the switch operation in non-selected groups 312. As in prior sections, the switches 306 in the non-selected groups 312 are closed to pre-charge the parasitic capacitance that is associated with the switches 306 and 308.

In FIGS. 5A–5E, it is noted that the number of switches 306 in each group 312 is set to n=4 for ease of discussion. As will be apparent, each group 312 could contain any number of switches 306. Furthermore, in FIGS. 5A–5E, the fine stage switches 306 are arranged into five groups 312 (312-1 to 312-5). As will be apparent, the fine stage switches 306 can be arranged into any number of groups.

In FIG. 5A, the tap 304-11 is the selected tap in the selected group 312-1. The tap 304-11 is at the absolute top of the resistor 302 so the signal attenuation to the output node 310 is a minimum. The switches 306-11 and 308-1 are closed to connect the selected tap 304-11 to the output 310. Additionally, the switches 306-24, 306-31, 306-44, and 306-51 in the corresponding non-selected groups 312-2 to 312-5 are also closed, so as to pre-charge the associated parasitic capacitance 314 for the corresponding non-selected groups.

It is noted that the locations of the switches 306 that are closed varies from over the groups 312. More specifically, the closed switches 306 in adjacent groups 312 are at mirror image locations about the boundary between the groups 312. For example, the selected switch 306-11 in FIG. 5A is the first switch in the group 312-1, and the switch 306-24 is the last switch in the group 312-2, which is the mirror image of the switch 306-11 about a boundary 316-1 between the groups 312-1 and 312-2. The switch 306-31 is the first switch in the group 312-3, which is the mirror image of the switch 306-24 in group 312-2 about a boundary 316-2 between the group 312-2 and 312-3. The switch 306-44 is the last switch in the group 312-4, which is the mirror image of the switch 306-31 in group 312-3 about a boundary 316-3 between the groups 312-3 and 312-4. The switch 306-51 is the first switch in the group 312-5, which is the mirror image of the switch 306-44 in the group 312-4 about a boundary 316-4 between the groups 312-4 and 312-5.

Figure 5B:
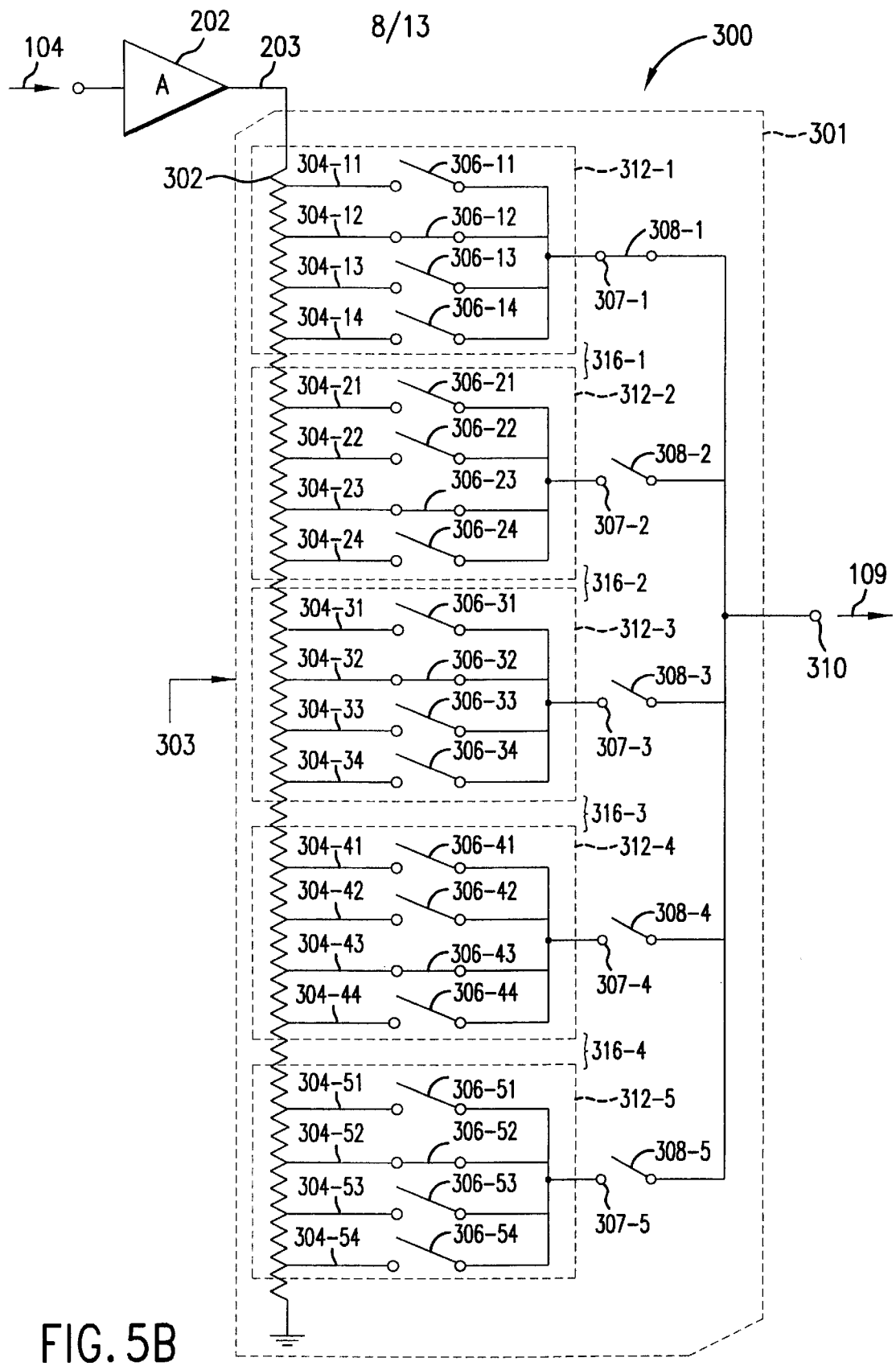

In FIG. 5B, tap 304-12 is the selected tap, and therefore the switches 306-12 and 308-1 are closed to connect the selected tap 304-12 to the output 310. Additionally, the switches 306-23, 306-32, 306-43, and 306-52 are closed in the corresponding non-selected groups 312-2 to 312-5, so as to pre-charge the parasitic capacitances of the switches 306 in these non-selected groups.

As in FIG. 5A, the closed switches 306 in adjacent groups 312 are at mirror image locations about the boundary between the adjacent groups 312. For example, the selected switch 306-12 is the second switch in the group 312-1, and the switch 306-23 is the third switch in the group 312-2, which is the mirror image of the selected switch 306-12 about the boundary 316-1. The switch 306-32 is the second switch in the group 312-3, which is the mirror image of the switch 306-23 in group 312-2 about the boundary 316-2. The switch 306-43 is the third switch in the group 312-4, which is the mirror image of the switch 306-32 in group 312-3 about the boundary 316-3. The switch 306-52 is the second switch in the group 312-5, which is the mirror image of the switch 306-43 in the group 312-4 about the boundary 316-4.

Figure 5C:
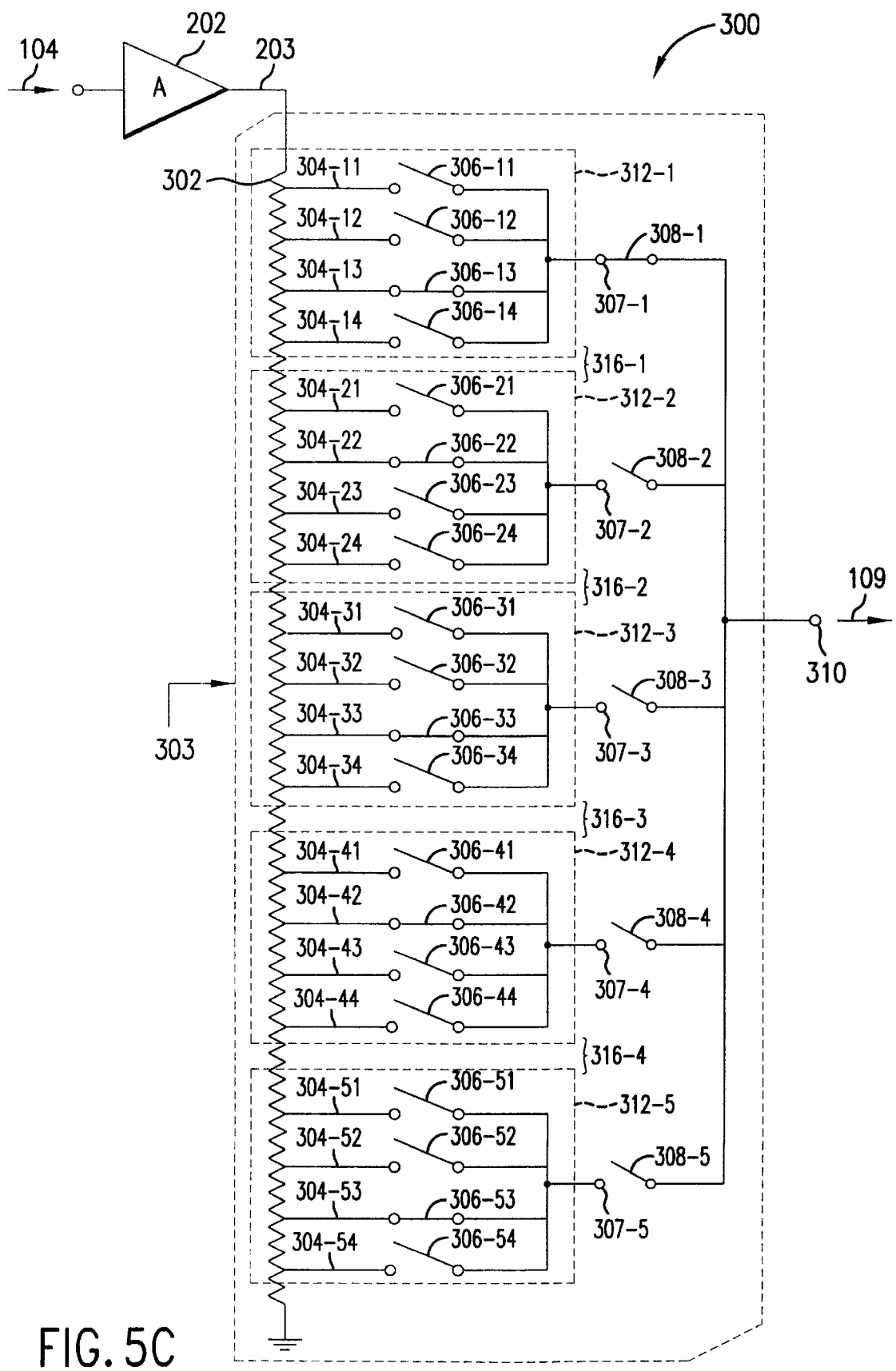

In FIG. 5C, tap 304-13 is the selected tap, and therefore the switches 306-13 and 308-1 are closed to connect the selected tap 304-13 to the output 310. Additionally, the switches 306-22, 306-33, 306-42, and 306-53 in the corresponding non-selected groups 312-2 to 312-5 are also closed, so as to precharge the parasitic capacitances of the switches 306 in the non-selected groups 312-2 to 312-5.

As in FIGS. 5A–5B, the closed switches 306 in adjacent groups 312 in FIG. 5C are at mirror image locations about the boundary between the adjacent groups 312. For example, the selected switch 306-13 is the third switch in the group 312-1, and the switch 306-22 is the second switch in the group 312-2, which is the mirror image of the switch 306-13 in group 312-1 about the boundary 316-1. The switch 306-33 is the third switch in the group 312-3, which is the mirror image of the switch 306-22 in the group 312-2 about the boundary 316-2. The switch 306-42 is the second switch in the group 312-4, which is the mirror image of the switch 306-33 in the group 312-3 about the boundary 316-3. The switch 306-53 is the third switch in the group 312-5, which is the mirror image of the switch 306-42 in the group 312-4 about the boundary 316-4.

Figure 5D:
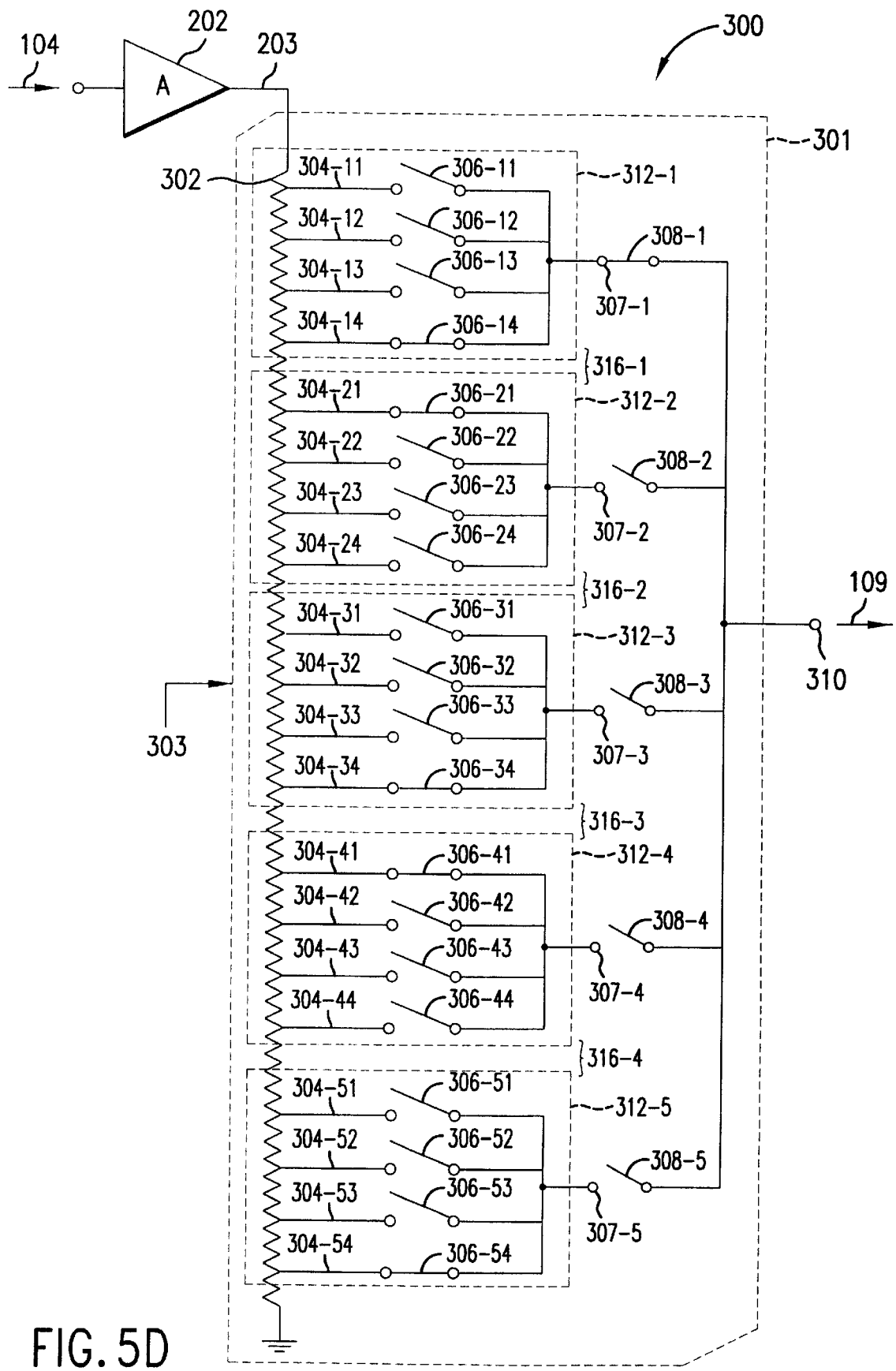

In FIG. 5D, the tap 304-14 is the selected tap, and therefore the switches 306-14 and 308-1 are closed to connect the selected tap 304-14 to the output 310. Additionally, the switches 306-21, 306-34, 306-41, and 306-54 in the corresponding non-selected groups 312-2 to 312-5 are also closed, so as to pre-charge the parasitic capacitances of the switches 306 in the non-selected groups 312-2 to 312-5.

As in FIGS. 5A–5C, the closed switches 306 in adjacent groups 312 are at mirror image locations about the boundary between the adjacent groups 312. For example, the selected switch 306-14 is the last switch in the group 312-1, and the switch 306-21 is the first switch in the group 312-2, which is the mirror image of the switch 306-14 in group 312-1 about the boundary 316-1. The switch 306-34 is the fourth switch in the group 312-3, which is the mirror image of the switch 306-21 in group 312-2 about the boundary 316-2. The switch 306-41 is the first switch in the group 312-4, which is the mirror image of the switch 306-34 in the group 312-3 about the boundary 316-3. The switch 306-54 is the last switch in the group 312-5, which is the mirror image of the switch 306-41 in the group 312-4 about the boundary 316-4.

Figure 5E:
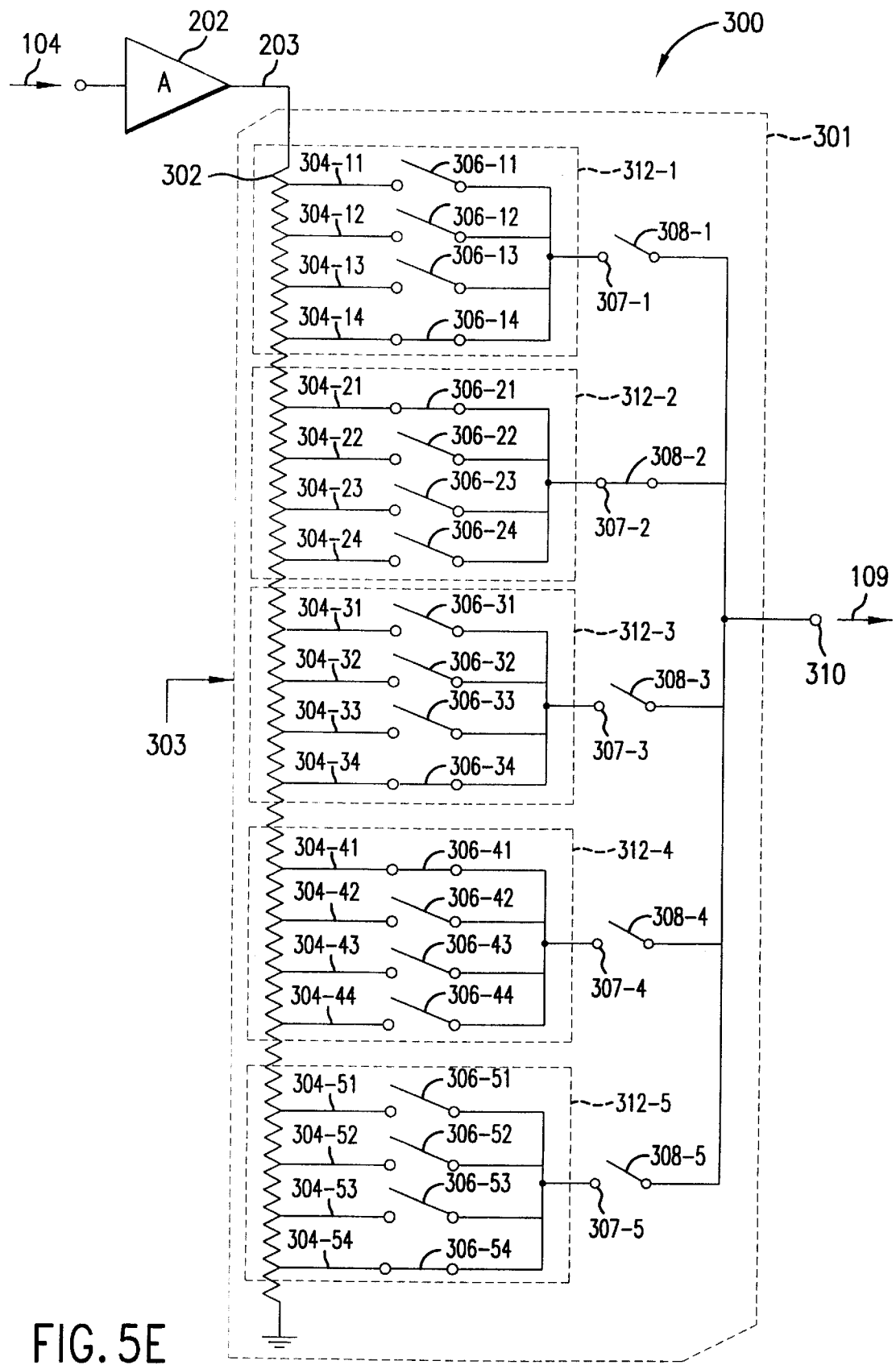

In FIG. 5E, tap 304-21 is the selected tap, and therefore the switches 306-21 and 308-2 are closed to connect the selected tap 304-21 to the output 310. It is noted that switch 306-21 is already closed because of the mirror image switch closing process for non-selected groups 312 that is illustrated by FIGS. 5A–5D. Since switch 306-21 is already closed, the parasitic capacitance that is associated with the switch 306-21 and the group 312-2 is already charged-up. This significantly reduces the transient voltage that is normally associated with tap changes, and improves the settling time for any transient voltage that remains. For example, in embodiments, the transient voltage is reduced from 100 mv to as low as 10 mV.

As stated above, the closed switches 306 in adjacent groups 312 are at mirror image locations about the boundary between the adjacent groups 312. The position of the closed switches 306 can be described in an equivalent but different manner. To preface this discussion, it is noted that the groups 312 are indexed from 1-to-n (e.g. 312-1, 312-2, etc.) Hence, there are even numbered groups 312 (e.g. 312-2,312-4) and odd numbered groups 312 (e.g. 312-1, 312-3, 312-5). For convenience, it is assume that the selected switch 306 is the $m^{th}$ switch (out of n) in a selected group 312. If the selected switch 306 is located in an even numbered group 312 (e.g. 312-2, 312-4, etc.), then the $m^{th}$ switch is closed in all the even numbered groups 312. Additionally, the $[(n+1)-m^{th}]$ switch 306 is closed in all the odd numbered groups 312. Similarly, if the selected switch 306 is located in an odd numbered group 312 (e.g. 312-1, 312-3, etc.), then the $m^{th}$ switch 306 is closed in all the odd numbered groups 312, and the $[(n+1)-m^{th}]$ is closed in the even numbered groups 312.

As an example, in FIG. 5A, the tap 304-11 is the selected tap so that the switches 306-11 and 308-1 are closed to connect the tap 304-11 to the output 310. The switch 306-11 is the first switch in the group 312-1, which is an odd numbered group. In accordance with the discussion above, the first switches 306 in the odd numbered groups 312 are to be closed. This is born out in FIG. 5A as switches 306-31 and 306-51 are closed in the odd numbered groups 312-3 and 312-5, respectively. Additionally, the $(n+1)-m^{th}$ switches are to be closed in the even numbered groups according to the discussion above. Since n=4 (as there are 4 switches in each group 312) and m=1 (as the first switch 306-11 corresponds to the selected tap 304-11), then:

$$(n+1)-m=(4+1)-1=4$$

Therefore, the 4th switch in the even numbered groups 312 is to be closed. This is born out in FIG. 5A as switches 306-24 and 306-44 are closed the groups 312-2 and 312-4, respectively. Note that switches 306-24 and 306-44 are the fourth switches in FIGS. 5A–5E.

As a second example, in FIG. 5B, the tap 304-12 is the selected tap so that the switches 306-12 and 308-1 are closed to connect tap 304-12 to the output 310. The switch 306-12 is the second switch in the group 312-1, which is an odd numbered group. In accordance with the discussion above, the second switch 306 in each odd numbered group 312 is to be closed. This is born out in FIG. 5B as switches 306-32 and 306-52 are closed in the odd numbered groups 312-3 and 312-5, respectively. Additionally, the $[(n+1)-m^{th}]$ switch is to be closed in each of the even numbered groups. Since n=4 and m=2, then:

$$(n+1)-m=(4+1)-2=3$$

Therefore, the 3rd switch in the even numbered groups 312 is to be closed. This is born out in FIG. 5B as switches 306-23 and 306-43 are closed the groups 312-2 and 312-4, respectively.

Figure 7:
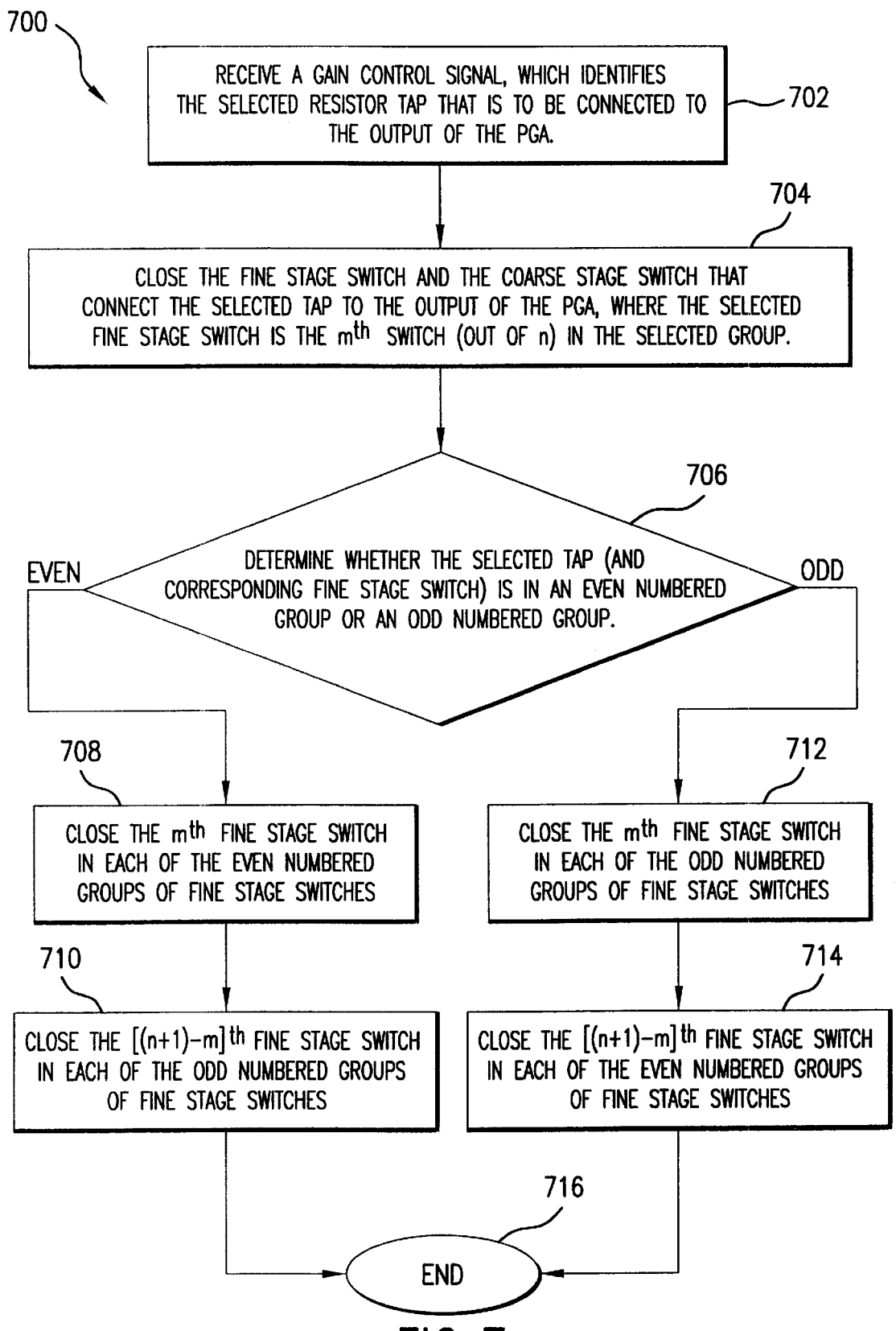
FIG. 7 illustrates a flowchart 700 of that describes the operating the switches in the PGA according to embodiments of the present invention.

The operation of the PGA 300 is further described according to flowchart 700 that is shown in FIG. 7, which is described as follows.

In step 702, a gain control signal is received that determines the attenuation of the variable resistor 301, and therefore the gain of the PGA 300. The gain control signal identifies the selected tap 304 that is to be connected to the output 310. For example, the gain control signal can be an automatic gain control (AGC) signal, such as AGC signal 117 (FIG. 1) that is generated by the AGC module 116.

In step 704, the fine stage switch 306 and the coarse stage switch 308 that correspond to the selected tap 304 are closed. The fine stage switch 306 that corresponds to the selected tap 304 is identified as the $m^{th}$ switch 306 (out of n) in the selected group 312. For example, in FIG. 5A, tap 304-11 is the selected tap so that the fine stage switch 306-11 and the coarse stage switch 308-1 are closed to connect the selected tap 304-11 to the output 310. The switch 306-11 is the first switch (out of 4) in the selected group 312-1.

In step 706, the determination is made as to whether the selected tap 304 and corresponding switch 306 are in an even numbered group 312 or an odd numbered group 312. If the selected tap 304 is in an even numbered group 312, then control flows to step 708. If the selected tap 304 is in an odd numbered group 312, then control flows to step 712. For example, in FIG. 5A, the selected tap 304-1 is in group 312-1, which is an odd numbered group.

In step 708, the selected tap 304 is in an even numbered group, therefore the $m^{th}$ switch 306 is closed in each even numbered group 312 that is a non-selected group 312 (Note that the switch corresponding to the selected tap 304 was closed in step 704). Additionally, in step 710, the $[(n+1)-m^{th}]$ switch 306 is closed in every odd numbered group 312.

In step 712, the selected tap 304 is in an odd numbered group, therefore the $m^{th}$ switch 306 is closed in every odd numbered group 312 that is a non-selected group 312 (Note that the switch 306 corresponding to the selected tap 304 was closed in step 704). Additionally, in step 714, the $[(n+1)-m^{th}]$ switch 306 is closed in every even numbered group 312. For example, in FIG. 5A, switches 306-31 and 306-51 are closed in additional to switch 306-11.

In step 716, the flowchart ends.

7. Transmission Line Characteristics of 2-Stage Switch Configuration

Figure 3B:
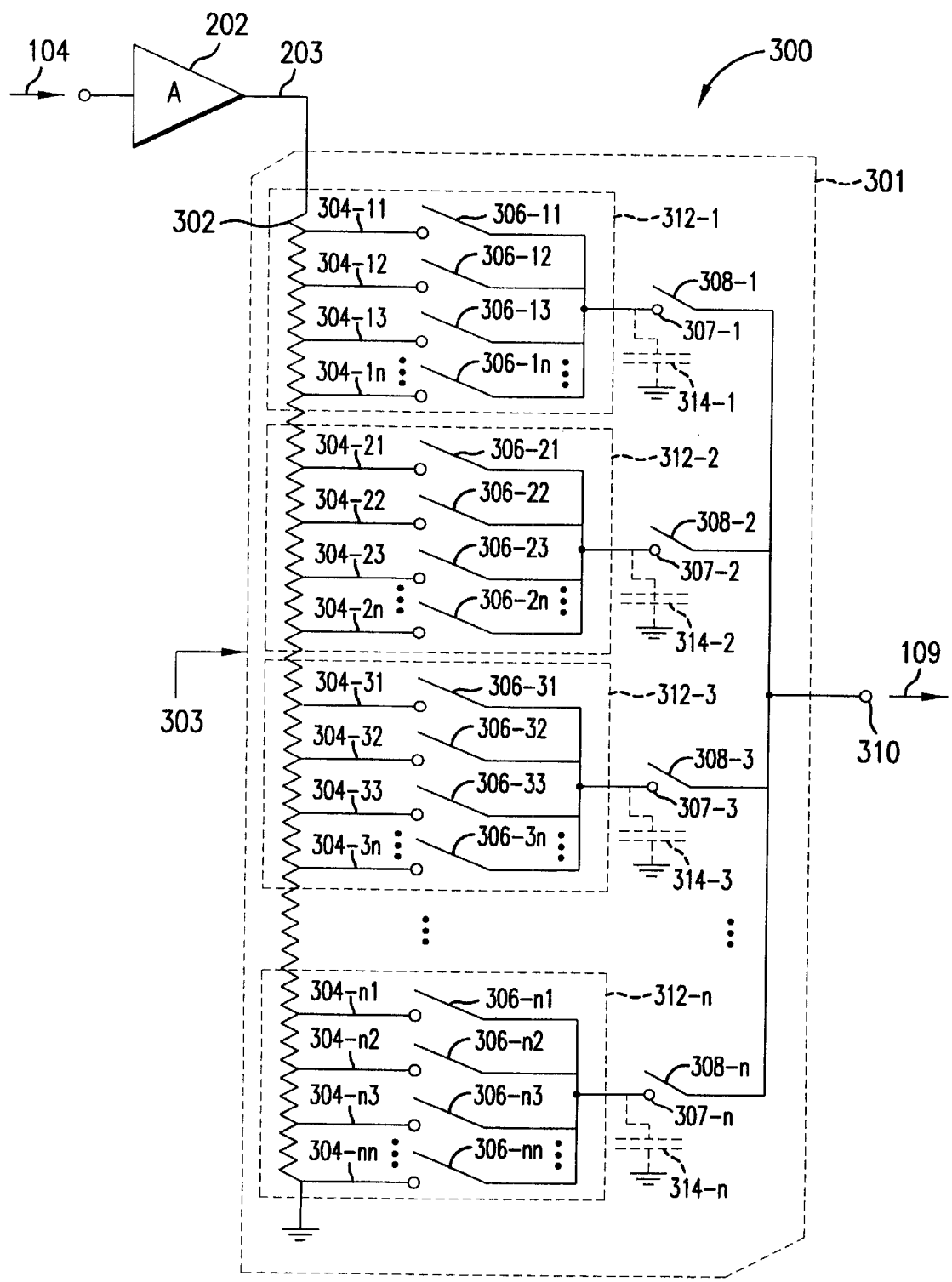
FIG. 3B illustrates a parasitic capacitance associated with the PGA 300.
Figure 6:
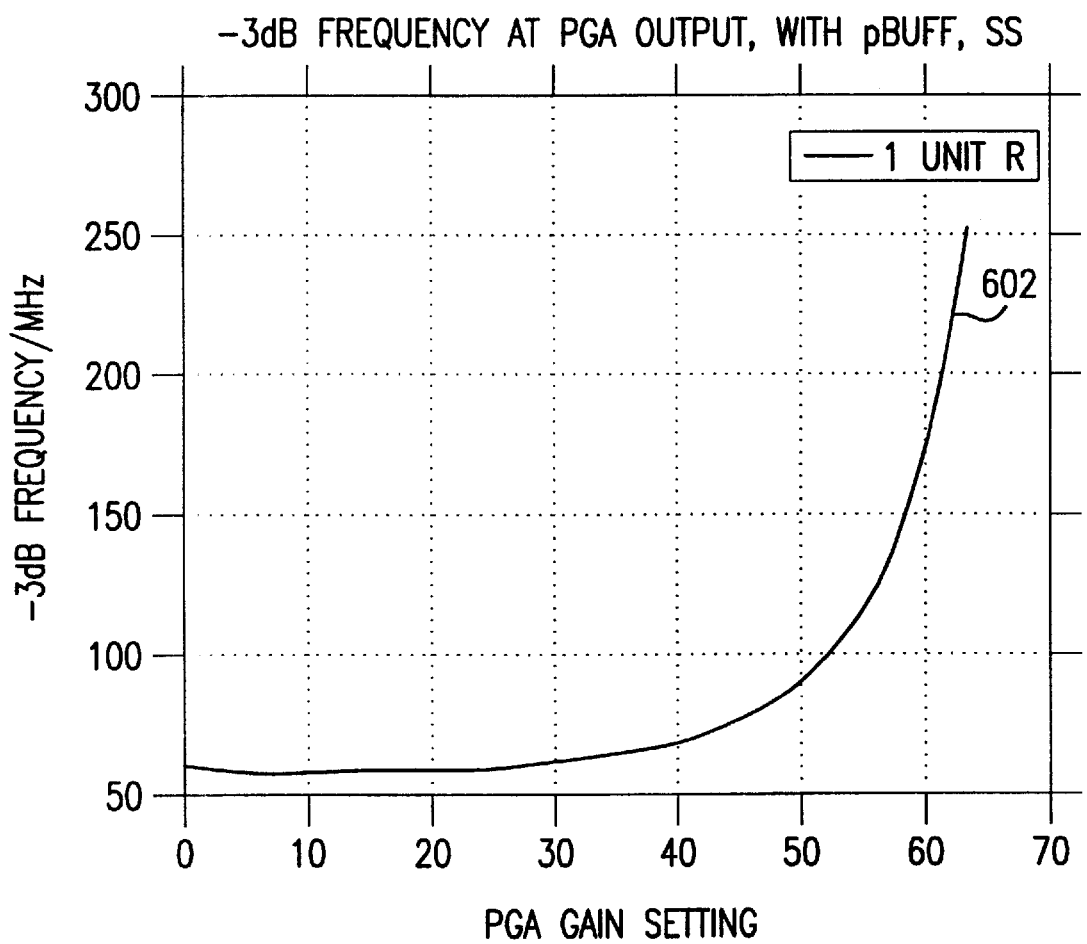
FIG. 6 illustrates the 3 dB cutoff frequency vs. PGA gain setting for a PGA that is operated according to embodiments of the present invention.

A further benefit of the PGA 300 with the 2-stage switch configuration is that the overall input impedance of the variable resistor 301 is closer to that of a transmission line. Referring to FIG. 3B, the resistor 302 and the parallel effective capacitors 314 have a distributed characteristic that closely approximates the impedance of a transmission line, for example a cable. As a result, the 3 dB cutoff frequency substantially matches that of transmission line, as illustrated by curve 602 in FIG. 6.

The input impedance of PGA 300 appears as a distributed RC network because the resistance and capacitance of the PGA 300 are distributed through the two stages. As a result, the PGA 300 has an amplitude roll-off that varies as $1/\sqrt{freq}$. Furthermore, in one embodiment, there is an inverse relationship between the PGA tap selection and the cable length (i.e. cable 102). For example, given a relatively short cable, tap 304-nn (FIG. 3A) can be selected to set a relatively high attenuation for the PGA 300. Given a relatively long cable, the tap 304-11 can be selected to set a relatively low attenuation for the PGA 300. By using this inverse relationship, less equalization is needed for the DSP 112.

8. Multi-stage Configurations

As described herein, the PGA 300 is a two-stage PGA. However, the invention is not limited to a two-stage PGA, as the present invention can be implemented in a multistage PGA having more than two stages. In other words, the switching configurations and methods described herein, can be implemented in a multi-stage PGA, as will be understood by those skilled in the arts based on the teachings given herein.

9. Other Applications

The PGA invention described herein has been discussed in reference to a receiver. However, the PGA is not limited to receivers, and is applicable to other non-receiver applications that benefit from low transient voltages and good frequency bandwidth. The application of the PGA invention to these non-receiver applications will be understood by those skilled in the relevant arts based on the discussions given herein, and are within the scope and spirit of the present invention.

10. Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A programmable gain amplifier (PGA), comprising:
    a resistor having a plurality of taps;
    a first group of n-fine stage switches, each fine stage switch in said first group having an output coupled to a first group output terminal;
    a second group of n-fine stage switches, each fine stage switch in said second group having an output coupled to a second group output terminal;
    each fine stage switch in said first group and said second group having an input coupled to a corresponding tap on said resistor;
    a first coarse stage switch having an input coupled to said first group output terminal, and an output coupled to an output of said PGA;
    a second coarse stage switch having an input coupled to said second group output terminal, and an output coupled to said output of said PGA; and
    wherein if a $m^{th}$ fine stage switch is closed in said first group, then a $((n+1)-m^{th})$ fine stage switch is closed in said second group.

2. The PGA of claim 1, further comprising an amplifier having an output coupled to an input of said resistor.

3. The PGA of claim 1, wherein said resistor is connected to a reference voltage.

4. The PGA of claim 1, wherein a location of said $((n+1)-m^{th})$ fine stage switch in said second group is a mirror image of a location of said $m^{th}$ fine stage in said first group.

5. A programmable gain amplifier (PGA), comprising:
    a resistor;
    a plurality of fine stage switches having inputs coupled to corresponding taps on said resistor, said fine stage switches arranged into two or more groups, each group having an output terminal and n-fine stage switches that are capable of being indexed from 1-to-n, said n-fine stage switches having outputs coupled said output terminal for said corresponding group; and
    two or more coarse stage switches corresponding to said two or more groups, each coarse stage switch having an input coupled to said output terminal for said corresponding group, each coarse stage switch having an output coupled an output of the PGA;
    wherein if a $m^{th}$ fine stage switch is closed in a first group, then a $((n+1)-m)^{th}$ fine stage switch is closed in a second group that is adjacent to said first group.

6. A programmable gain amplifier (PGA), comprising:
    an amplifier;
    a resistor having a first terminal coupled to an output of said amplifier and a second terminal coupled to a reference voltage, said resistor having a plurality of taps between said first terminal and said second terminal;
    a plurality of fine stage switches having inputs coupled to corresponding taps on said resistor, said fine stage switches arranged into two or more groups, each group having an output terminal and n-fine stage switches that are capable of being indexed from 1-to-n, each n-fine stage switch in said groups having an output coupled said output terminal for said corresponding group; and
    two or more coarse stage switches corresponding to said two or more groups, each coarse stage switch having an input coupled to said output terminal for said corresponding group, each coarse stage switch having an output coupled an output of the PGA;
    wherein if a $m^{th}$ fine stage switch is closed in a first group, then a $((n+1)-m)^{th}$ fine stage switch is closed in a second group that is adjacent to said first group.

7. The PGA of claim 6, wherein said resistor, said plurality of fine stage switches, and said two or more coarse stage switches are deposited on a common substrate.

8. The PGA of claim 7, wherein said amplifier is also deposited on said common substrate.

9. The PGA of claim 7, wherein said common substrate is CMOS.

10. The PGA of claim 6, wherein said amplifier, said resistor, said plurality of fine stage switches, and said two or more coarse stage switches are deposited on a common CMOS substrate.

11. A method of adjusting the gain of a programmable gain amplifier (PGA), the PGA having a resistor with a plurality of taps and a switch network between the taps and an output of said PGA, the switch network having a plurality of fine stage switches coupled to said plurality of taps, the taps and corresponding fine stage switches arranged into two or more groups, the two or more groups including even numbered groups and odd numbered groups, the method comprising the steps of:
    receiving a gain control signal that identifies a selected tap of said plurality of taps that is to be connected to the PGA output;
    if said selected tap is in an even numbered group, then closing a $m^{th}$ fine stage switch in each even-numbered group, and closing a $[(n+1)-m]^{th}$ fine stage switch in each odd-numbered group.

12. The method of claim 11, further comprising the step of:
    if said selected tap is in an odd numbered group, then closing a $m^{th}$ fine stage switch in each odd-numbered group, and closing a $[(n+1)-m]^{th}$ fine stage switch in each even-numbered group.

13. The method of claim 11, further comprising the step of closing a coarse stage switch that corresponds to a group having said selected tap.

14. The method of claim 13, further comprising the step opening said coarse stage switch and closing a second coarse stage switch to adjust the gain of said PGA, without opening a previously closed fine stage switch.

15. A method of adjusting the gain of a programmable gain amplifier (PGA), the PGA having a resistor with a plurality of taps and a switch network between the taps and an output of said PGA, the switch network having a plurality of fine stage switches coupled to said plurality of taps, the taps and corresponding fine stage switches arranged into two or more groups, the two or more groups including even numbered groups and odd numbered groups, the method comprising the steps of:

closing a $m^{th}$ fine stage switch that corresponds to a selected tap of said plurality of taps in a selected group of said plurality of groups;

if said selected tap is one of said even numbered groups, then closing a $m^{th}$ fine stage switch in each of said even-numbered groups that is a non-selected group, and closing a $[(n+1)-m]^{th}$ fine stage switch in each one of said odd-numbered groups; and if said selected tap is one of said odd numbered groups, then closing a $m^{th}$ fine stage switch in each of said odd-numbered groups that is a non-selected group, and closing a $[(n+1)-m]^{th}$ fine stage switch in each one of said even-numbered groups.

16. The method of claim 15, further comprising the step of closing a coarse stage switch that corresponds to said selected group.

17. The method of claim 16, further comprising the step opening said coarse stage switch and closing a second coarse stage switch to adjust the gain of said PGA, without opening said $m^{th}$ fine stage switch that corresponds to said selected tap.

18. A method of adjusting the gain of a programmable gain amplifier (PGA), the PGA having a resistor with a plurality of taps and a switch network between the taps and an output of said PGA, the switch network having a plurality of fine stage switches coupled to said plurality of taps, the fine stage switches arranged into two or more groups, the method comprising the steps of:

closing a first fine stage switch in a first group of said two or more groups; and closing a second fine stage switch in a second group of said two or more groups, said second group adjacent to said first group and defining a boundary between said first group and said second group, said second fine stage switch located at a mirror image about said boundary relative to a location of said first fine stage switch.

19. The method of claim 18, further comprising the step of closing a coarse stage switch that corresponds to said first group.

20. The method of claim 19, further comprising the steps of opening said coarse stage switch that corresponds to said first group, and closing a second coarse stage switch that corresponds to said second group.

* * * * *